US 6,728,140 B2

(12) United States Patent
Han et al.

(10) Patent No.: US 6,728,140 B2
(45) Date of Patent: Apr. 27, 2004

(54) THRESHOLD VOLTAGE CONVERGENCE

(75) Inventors: Kyung Joon Han, Palo Alto, CA (US); Joo Weon Park, Pleasanton, CA (US); Gyu-Wan Kwon, Cupertino, CA (US); Dung Tran, San Jose, CA (US); Steve K. Hsia, San Jose, CA (US); Jong Seuk Lee, Palo Alto, CA (US); Dae Hyun Kim, Fremont, CA (US)

(73) Assignee: NexFlash Technologies, Inc., San Jose, CA (US)

( * ) Notice: Subject to any disclaimer, the term of this patent is extended or adjusted under 35 U.S.C. 154(b) by 132 days.

(21) Appl. No.: 10/011,157

(22) Filed: Dec. 5, 2001

(65) Prior Publication Data

US 2003/0103381 A1 Jun. 5, 2003

(51) Int. Cl.[7] .............................................. G11C 16/04
(52) U.S. Cl. ........................... 365/185.24; 365/185.26; 365/185.3; 365/185.29
(58) Field of Search ..................... 365/185.24, 218, 365/185.26, 185.3, 185.29, 185.01

(56) References Cited

U.S. PATENT DOCUMENTS

| 5,295,107 A | 3/1994 | Okazawa et al. ........... 365/218 |
| 5,357,476 A | 10/1994 | Kuo et al. .................. 365/218 |
| 5,412,608 A | 5/1995 | Oyama ........................ 365/218 |
| 5,521,867 A | 5/1996 | Chen et al. ............. 365/185.33 |
| 5,602,779 A * | 2/1997 | Gotou .................... 365/185.23 |
| 5,991,203 A | 11/1999 | Choi ...................... 365/185.27 |
| 6,031,766 A * | 2/2000 | Chen et al. ............... 365/185.3 |
| 6,094,373 A | 7/2000 | Saito ...................... 365/185.22 |
| 6,118,705 A | 9/2000 | Gupta et al. ........... 365/185.29 |
| 6,249,459 B1 | 6/2001 | Chen et al. ............. 365/185.26 |
| 2002/0167843 A1 * | 11/2002 | Hsia et al. ............. 365/185.28 |
| 2003/0026132 A1 * | 2/2003 | Chen et al. ............. 365/185.18 |

OTHER PUBLICATIONS

K. Oyama et al., *A Novel Erasing Technology for 3.3V Flash Memory with 64Mb Capacity and Beyond*, IEDM Technical Digest (IEEE, 1992), at 607–610, 633 [6 pages total, including cover page].

* cited by examiner

*Primary Examiner*—Richard Elms
*Assistant Examiner*—Toan Le
(74) *Attorney, Agent, or Firm*—Altera Law Group, LLC

(57) ABSTRACT

A convergence signal includes a series of voltage pulses used to perform a convergence procedure in one or more flash EEPROM memory cells (transistors). In one instance subsequent voltage pulses in the convergence signal each have a higher voltage than the preceding pulse. In another instance, subsequent voltage pulses in the convergence signal each have a longer duration than the preceding pulse. An integrated circuit includes an array of memory cells and an erase control unit which controls the application of the convergence signal to one or more memory cells. The integrated circuit may be either serial or parallel flash EEPROM in which bulk, sector, or page mode erasing is used.

51 Claims, 12 Drawing Sheets

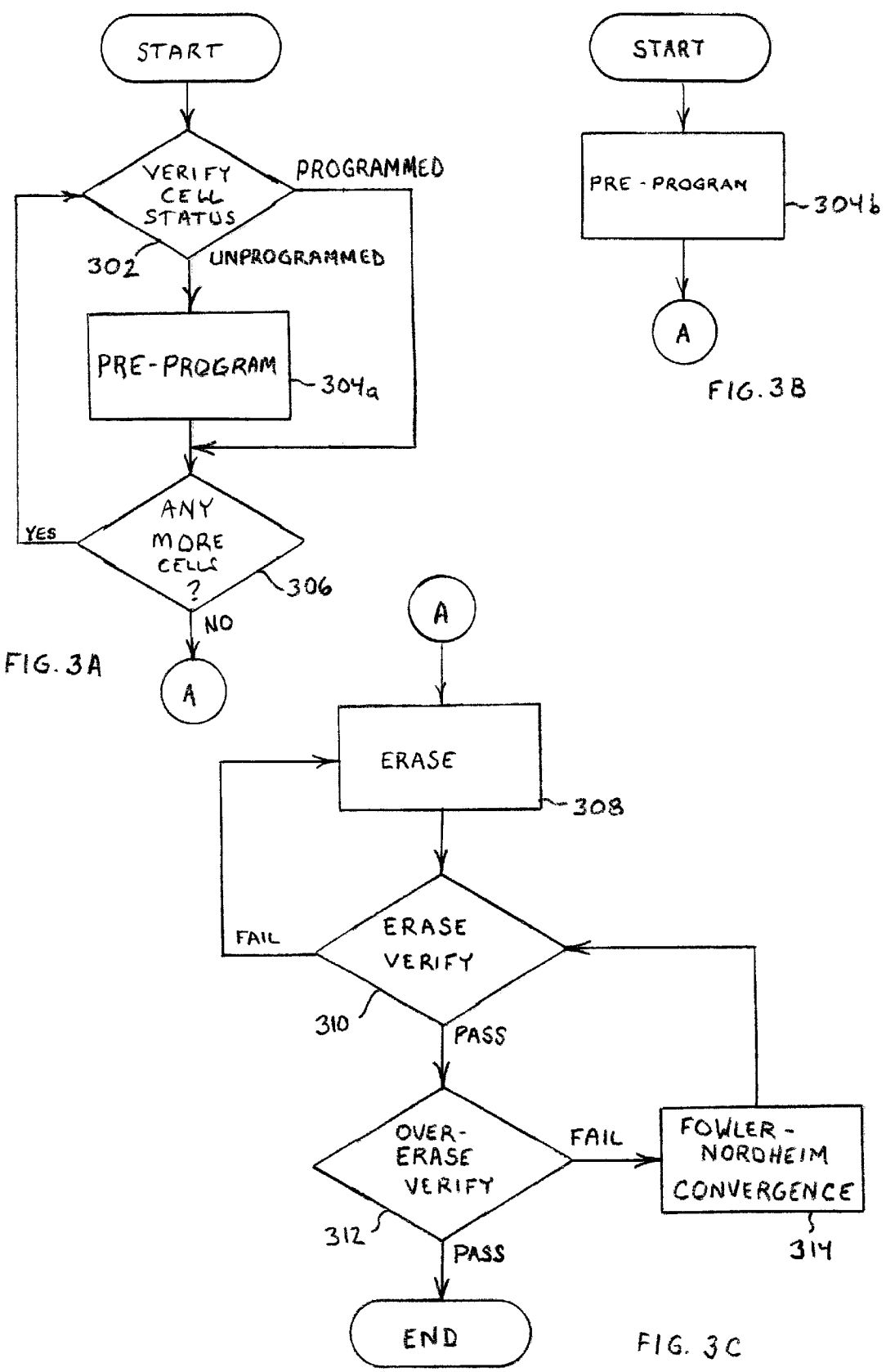

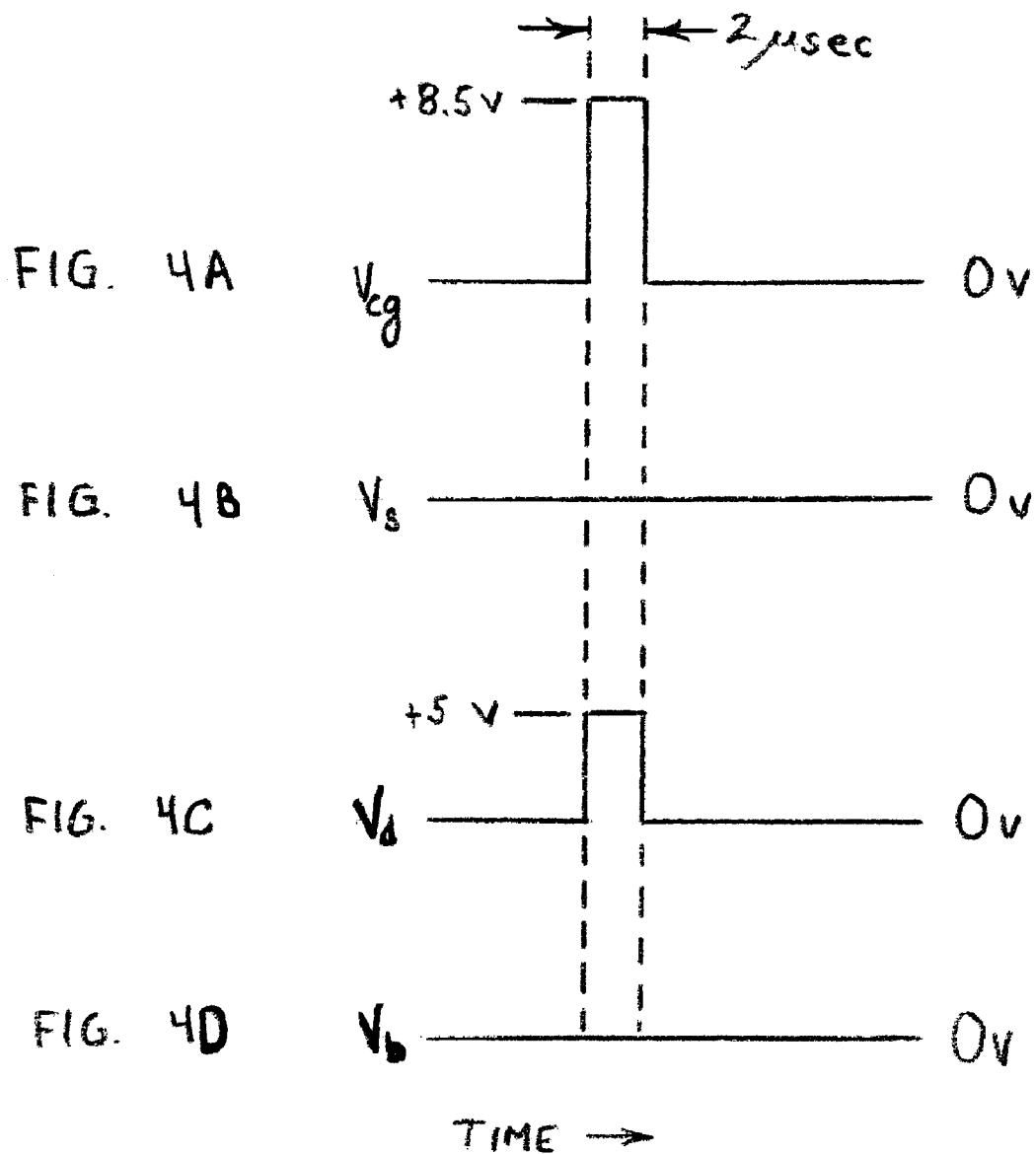

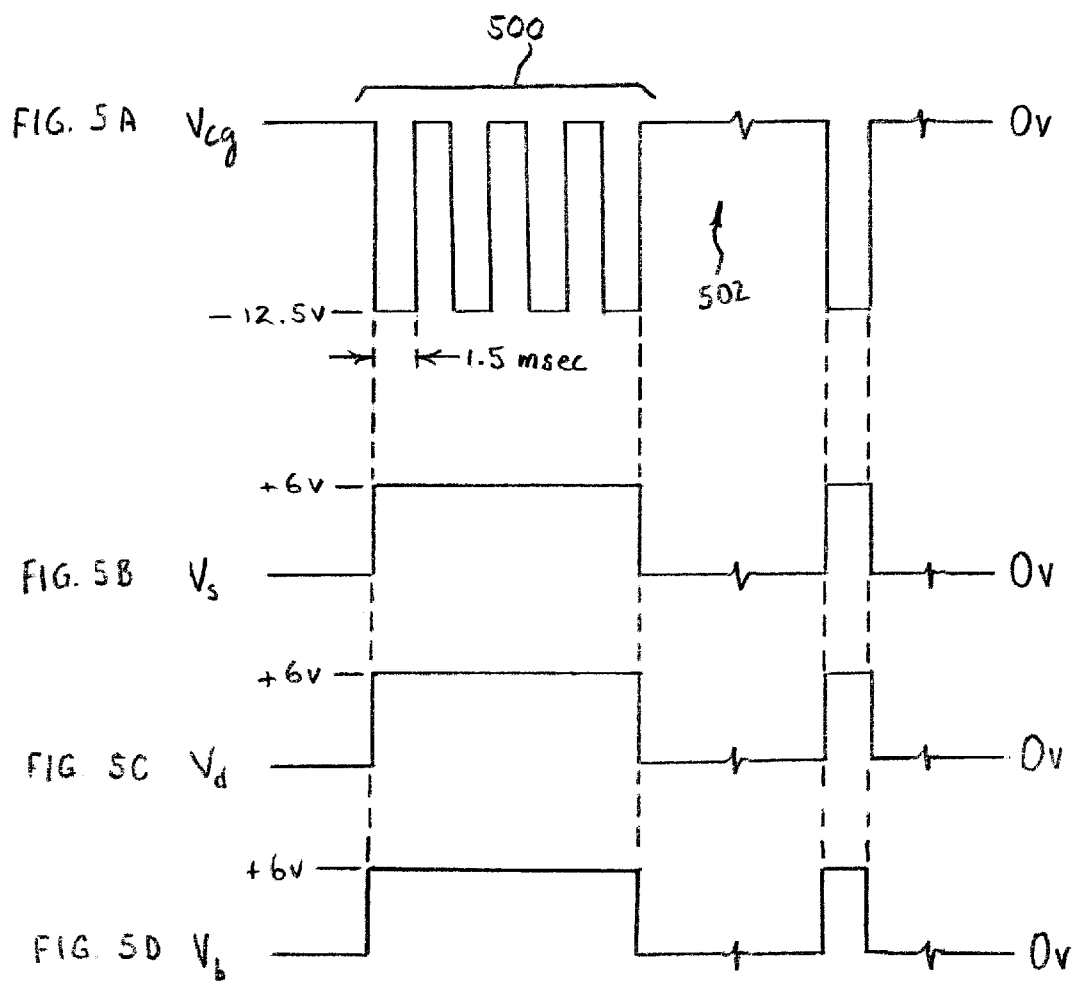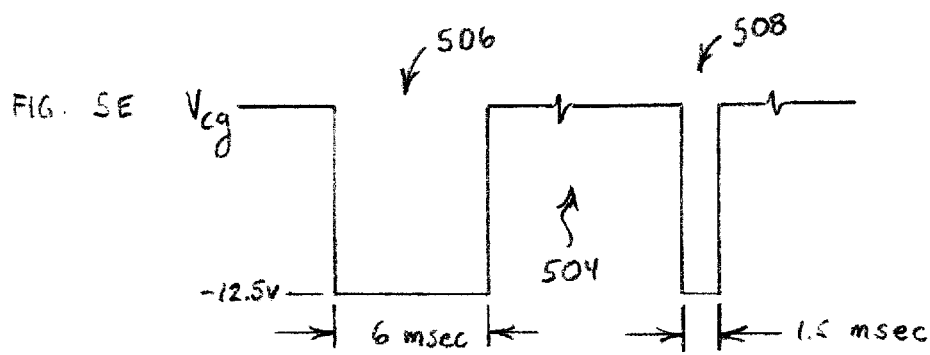

THRESHOLD VOLTAGE CONVERGENCE

BACKGROUND

1. Field of Invention

The invention is related to flash electronically erasable programmable read only memory (flash EEPROM), and more particularly to convergence of threshold voltages of flash EEPROM transistors.

2. Related Art

Flash EEPROM memory cells (typically field-effect transistors) are used as non-volatile memory that can be programmed in the field. Some flash EEPROM integrated circuits are designed to receive and output data using single terminals and are known as serial flash EEPROM. Other flash EEPROM integrated circuits are designed to receive and output data in parallel using multiple terminals and are known as parallel flash EEPROM.

In some instances all memory cells in an array of flash EEPROM memory cells are simultaneously erased in a single, bulk erase procedure. In other instances, only a sector of the memory cells in the array is erased. In still other instances, the data storage addresses for the memory cells in the array are partitioned into logical memory pages, and one or more unique pages are erased. Each page typically includes logical words (e.g., 8-bit bytes).

Flash EEPROM erase operations generally include two basic operations. The first (erase) procedure lowers the threshold voltage of all memory cells so that the cells each have an unprogrammed state. This erase procedure typically results in a distribution of threshold voltages among the cells being erased with some cells having their threshold voltages lowered below a specified minimum threshold voltage. These cells are considered over-erased. Thus a subsequent second (threshold voltage convergence) procedure raises unacceptably low threshold voltages. The threshold voltage convergence procedure further reduces the threshold voltage distribution for all memory cells being erased.

Software application designers, especially when working with serial flash EEPROM integrated circuits, require fast page erase operations to allow for subsequent reprogramming of the erased page. A disadvantage of present erase and convergence procedures, however, is that these procedures require too much time. In one instance, for example, 0.1 second (sec) erase and convergence pulses are used. What is required, therefore, is a method of speeding up flash EEPROM memory cell erase operations, especially the convergence procedure, and a flash EEPROM integrated circuit capable of carrying out this fast convergence procedure.

Flash EEPROMs typically include a small number of memory cells for which charge is more rapidly stored, removed, or lost than for the remaining cells. These "fast" cells may lose charge after being programmed such that their threshold voltage falls below the lower threshold voltage limit that signifies a cell is programmed. Other programmed memory cells may have a marginally low threshold voltage for various reasons. It is therefore also desirable to have a way to converge the threshold voltage distribution of programmed cells by raising marginally programmed cells without significantly affecting programmed cells that are well within the programmed threshold voltage range.

SUMMARY

A convergence signal includes a series of voltage pulses used to perform a convergence procedure in one or more flash EEPROM memory cells (transistors). In one instance subsequent voltage pulses in the convergence signal each have a higher voltage than the preceding pulse. The convergence signal having increasingly positive voltage pulses is applied to the control gate of a flash EEPROM transistor while the source, drain, and bulk regions of the transistor receive a negative voltage. The voltage pulses received by the control gate cause electrons to be drawn from the transistor's bulk channel region into the floating gate using Fowler-Nordheim tunneling. The pulse durations and voltages are selected to quickly raise the threshold voltage of transistors initially having low threshold voltages and to more slowly raise the threshold voltage of transistors initially having a higher threshold voltage. In another instance, subsequent voltage pulses in the convergence signal each have a longer duration than the preceding pulse.

An integrated circuit includes an array of memory cells and a control unit which controls the application of the convergence signal to one or more memory cells. The integrated circuit may be either serial flash EEPROM or parallel flash EEPROM in which bulk, sector, or page mode erasing is used.

BRIEF DESCRIPTION OF THE DRAWINGS

FIGS. 3A–3C are diagrammatic views of embodiments of a process.

FIGS. 4A–4D are signal timing diagrams.

FIGS. 5A–5E are signal timing diagrams.

DETAILED DESCRIPTION

Figure 1:
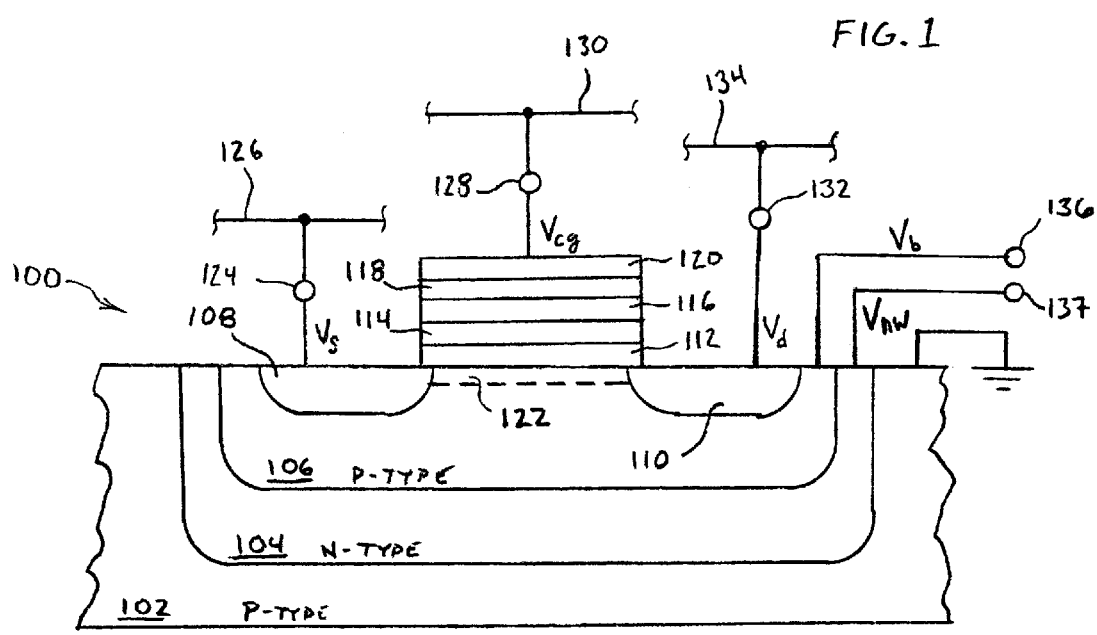
FIG. 1 is a cross-sectional view of a memory cell.

The accompanying drawings are illustrative and not to scale. For example, various interval durations may exist between pulses shown and described herein. Skilled individuals will understand that pulse shapes shown in the drawings are illustrative of various pulse shapes that may be used. Skilled individuals will also understand that some well-known features have been omitted from the drawings so as to more clearly show the embodiments. The same reference number used in several drawings refers to the same or to a substantially similar element.

FIG. 1 is a cross-sectional view of an illustrative flash electronically erasable programmable read only memory (flash EEPROM) field effect transistor 100 (a memory cell) formed using conventional methods. Memory cell 100 includes P-type monocrystalline silicon substrate 102, deep N-well 104 formed in substrate 102, and P-well 106 (bulk region) formed in N-well 104. N-type source region 108 and N-type drain region 110 are formed in bulk region 106. Skilled individuals understand that in many cases the source and drain regions are interchangeable and each may therefore be referred to as a source/drain region. Tunnel oxide layer 112 (e.g., silicon dioxide about 90–100 Angstrom (Å) thick) is formed over bulk region 106 between source region 108 and drain region 110. Floating gate 114 (e.g., approximately 0.15 micrometer ($\mu$m) thick lightly N-doped polycrystalline silicon having a resistivity of about 6000–8000 Ohm per square) is formed over oxide layer 112. Gate insulation layer 116 (e.g., a silicon oxide, silicon nitride, silicon oxide (ONO) sandwich layer about 145–165 Å thick) is formed over floating gate 114. Control gate 118 (e.g., heavily N-doped polycrystalline silicon) is formed over insulation layer 116, and conductive layer 120 (e.g., tungsten silicide ($WSi_2$)) is formed directly on control gate 118. Bulk channel 122 is defined in bulk region 106 between source region 108 and drain region 110 underlying gates 114,118. In one embodiment cell 100 occupies an area of about 3F by 1.9F, where F is the minimum feature size (e.g., 0.18 $\mu$m).

Memory cell 100 is typically included in an array of rows and columns of similar memory cells. In such arrays, source region 108 is electrically coupled via source terminal 124 to source line 126 and receives a source signal of voltage $V_s$. Control gate 118 is electrically coupled via control gate terminal 128 to word line 130 and receives a word line signal of voltage $V_{cg}$. Drain region 110 is electrically coupled via drain terminal 132 to bit line 134 and receives a bit line signal of voltage $V_d$. Bulk region 106 receives a bulk signal of voltage $V_b$ via bulk terminal 136. Deep N-well 104 is coupled to terminal 137 and receives an N-well signal of voltage $V_{nw}$. Substrate 102 is grounded. In other embodiments, however, substrate 102 may receive other voltages.

Figure 2:
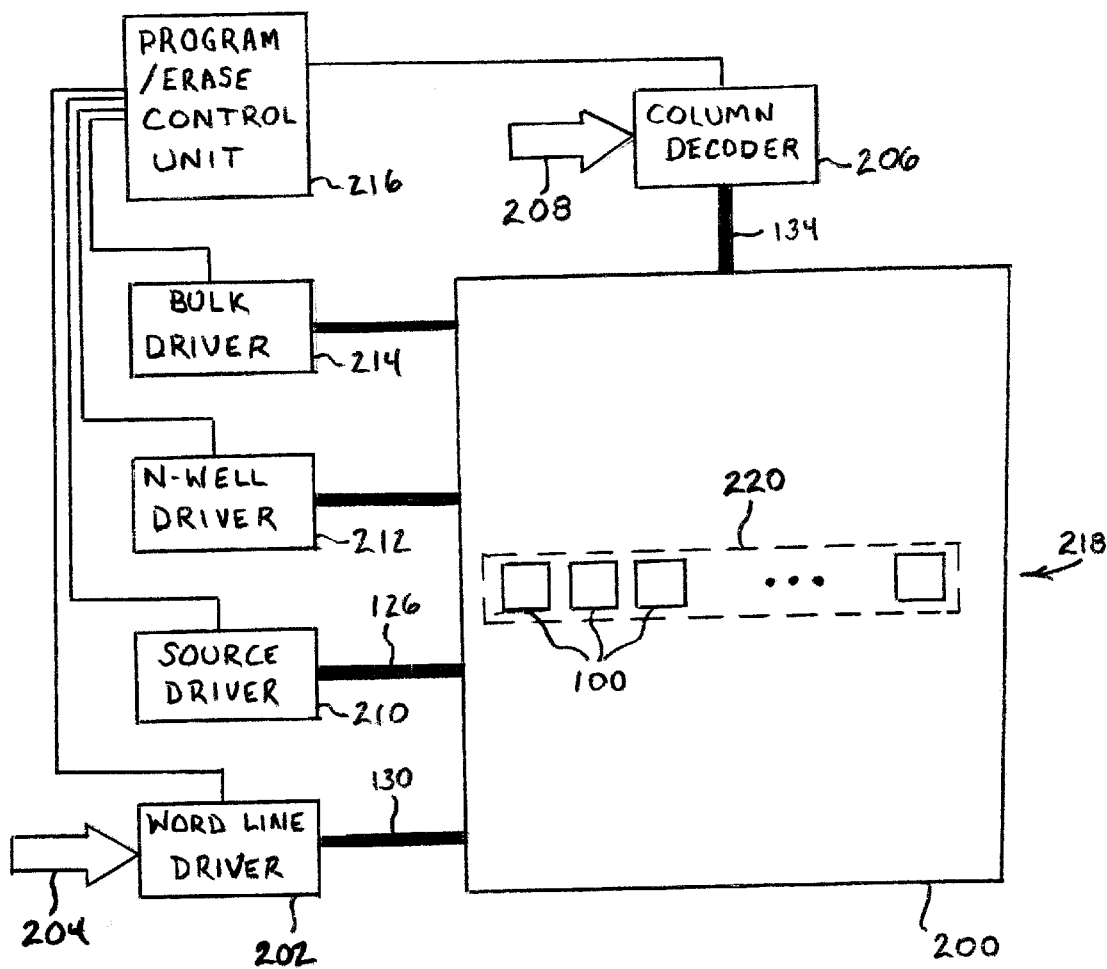
FIG. 2. is a diagrammatic view of a memory array and peripheral circuits in an integrated circuit.

FIG. 2 is a diagrammatic view illustrating an array 200 of integrated circuit memory cells that includes memory cells 100, formed on a single integrated circuit chip. FIG. 2 also illustrates peripheral circuits on the chip that drive the memory cells. Each set of memory cells coupled to a unique word line 130 is a row. Each set of memory cells coupled to a unique bit line 134 is a column. Skilled individuals will understand that word line driver 202 receives row address information 204 and in response sets the voltages on word lines 130. Likewise, column decoder 206 receives column address information 208 and in response sets the voltages on bit lines 134. Source driver 210 sets the voltages on source lines 126. N-well driver 212 sets the voltage in N-wells 104 (FIG. 1). Bulk driver 214 sets the voltage in bulk regions 106 (FIG. 1). Program/erase control unit 216 is coupled to and controls the operation of word line driver 202, column decoder 206, source driver 210, N-well driver 212, and bulk driver 214 during program and erase operations.

The circuit shown in FIG. 2 is illustrative of many memory circuit topologies. One such topology is serial read-only memory (ROM), in which data is serially received and written to the memory cells. Another such topology is parallel ROM, in which data is received in parallel and subsequently written to the memory cells. Other circuits related to writing and reading (e.g., sense amplifiers) are well known and are omitted for clarity. The circuit shown in FIG. 2 is illustrative of both serial flash EEPROM, in which data is serially received and output using single terminals, and parallel flash EEPROM, in which data is received and output in parallel using multiple terminals. FIG. 2 is also illustrative of many memory array 200 architectures that are used in accordance with the invention. For example, in one embodiment array 200 is a virtual ground array. Other embodiments include NAND and NOR memory array architectures.

In some embodiments, a particular physical set of memory cells is considered a logical set. For example, in the embodiment illustrated in FIG. 2, the set of transistors in row 218 is defined as a logical page 220 of memory. A page is further divided into words or bytes (e.g., eight bits). In an illustrative 64 Mbit ($2^{26}$) memory array there are about 16K ($2^{14}$) rows and about 4K ($2^{12}$) columns, thus allowing for 16,384 pages and 512 8-byte words per page. By setting voltages as described below, memory cells in page 220 (row 218) are erased while cells in other logical pages (physical rows) retain their programmed information. In some cases the set of transistors defining a page is less than all transistors in a single row. In some cases, all memory cells in the array are erased in a bulk erase operation.

Referring again to FIG. 1, the transistor's threshold voltage ($V_T$) represents the programming state of cell 100. In a programmed state the threshold voltage prevents current flow from source region 108 to drain region 110 when a read voltage applied to control gate 118. This programmed state typically represents a logical 0, low, or off. In an unprogrammed state, the threshold voltage allows current flow between source region 108 and drain region 110 when a read voltage is applied to control gate 118. The unprogrammed state typically represents a logical 1, or high, or on. Skilled individuals understand that the amount of charge (electrons, holes) stored in floating gate 114 controls the threshold voltage of memory cell 100. Such individuals understand that charge is added to or removed from the floating gate by introducing various voltages to the source, drain, and bulk regions, and to the control gate. Such individuals further understand that charge is moved by hot carrier injection or Fowler-Nordheim tunneling, depending on the points at which voltages are applied and upon the voltage levels. Since charge remains stored in the floating gate for a considerable time (e.g., years) memory cell 100 is considered non-volatile.

Due to slight physical variations in each transistor (e.g., variations in the tunnel oxide layers), there is a distribution of rates at which charge moves into or out of the floating gate. As compared with most memory cell transistors in a particular memory array, transistors in which charge moves relatively quickly into and out of the floating gate are considered "fast", and transistors in which charge moves relatively slowly into and out of the floating gate are considered "slow". During erase operations, fast transistors are may become over-erased. In an over-erase condition, a transistor's $V_T$ is reduced such that current may "leak" from the source region to the drain region, or such that a subsequent programming voltage is insufficient to raise the $V_T$ to a programmed state. Conversely, slow transistors may not have enough charge removed to reach an erased state.

FIGS. 3A, 3B, and 3C are diagrammatic views of erase process embodiments in accordance with the invention. The embodiments are used for erasing either a memory page or for bulk erase. FIGS. 3A and 3B show alternate beginnings which then proceed to FIG. 3C.

Referring to FIG. 3A, in 302 the programming status of one or more cells to be erased is verified. In one instance a read operation is performed by setting $V_{cg}$ to +4.6 V and sensing current through one or more memory cells. Each read takes about 0.2 $\mu$sec, and for 512 words the page read takes about 0.1 msec. If current (e.g., more than 1 $\mu$A) is sensed, indicating an unprogrammed cell, the process moves to 304a. If no current is sensed, indicating a programmed cell, the process moves to 306.

In 304a a pre-erase programming (pre-program) is performed to program one or more unprogrammed memory cells that are to be erased. In one embodiment, the pre-program operation is performed one word at a time, although other cell combinations may be used during pre-programming. As illustrated by FIGS. 4A–4D, in one embodiment the pre-programming is performed by causing channel hot electrons to be injected into the floating gate of the unprogrammed cell. $V_{cg}$ receives a +8.5 V pulse and $V_d$ receives a +5 V pulse while $V_s$ and $V_b$ remain at ground. The $V_{cg}$ and $V_d$ pulses each last about 2 microseconds (µsec), and for 512 words the pre-program operation takes about 1.1 msec. Thus the $V_T$ for all cells to be erased is raised to approximately the same value. Programming to ensure that each cell to be erased has approximately the same $V_T$ helps to reduce over-erasing during subsequent erase operations.

In 306 it is determined if any cells to be erased remain that require programming status verification. If cells remain, the process moves to 302. If no cells remain, the process moves to 308 (FIG. 3C).

Alternatively, the programming status verification described with reference to FIG. 3A is omitted and a pre-program operation 304b is performed on all cells to be erased, as illustrated by FIG. 3B. One embodiment of 304b uses the voltages shown in FIGS. 4A–4D as described above. A 2 µsec pulse is sufficient to pre-program all cells. Since $V_T$ change tends to slow as $V_T$ rises, an additional programming pulse applied to programmed cells will not have significant impact on the programmed cells' $V_T$. Even so, the $V_T$ distribution of all cells after preprogramming is likely to be slightly higher using the process in FIG. 3B than if using the process in FIG. 3A. The process in FIG. 3B is faster than the process in FIG. 3A. After 304b, the process moves to 308 (FIG. 3C).

Referring to FIG. 3C, in 308 an erase is performed to reduce the $V_T$ for each cell below a specified maximum. As illustrated by FIGS. 5A–5D, in one embodiment the erase is done by applying a +6 V pulse to $V_b$, $V_s$, and $V_d$ as $V_{cg}$ receives a series (e.g., four) of −12.5 V pulses 500, the pulses each lasting about 1.5 milliseconds (msec). The number of pulses, and the voltage and duration of each pulse, is selected so that most cells other than abnormally fast or slow cells will be erased by the initial set of pulses 500. In the interval 502 following the last pulse in the series, an erase verify (described below) is performed. If additional erasing is required, one or more additional erase pulse and erase verify combinations are used until erasing is complete. Various other numbers of pulses and pulse durations may be used, and the potential difference between the control gate and source/drain/bulk regions may be varied. For example, FIG. 5E illustrates erasing using a single long pulse 506 (e.g., about 6 msec) instead of a series of short pulses. $V_s$, $V_d$, and $V_b$ (and $V_{nw}$) settings are timed to match the $V_{cg}$ erase pulse. The erase verify is performed in interval 504 following the long pulse. If additional erasing is required, one or more short pulse 508 (e.g., about 1.5 msec) and erase verify combinations are used until all cells are erased. Using a series of shorter erase pulses 500, as illustrated by FIG. 5A, produces a tighter $V_T$ distribution than when a single, longer pulse 506 is used ($V_T$ change during erase is similar to $V_T$ change during convergence, as described below with reference to FIGS. 6, 7, and 8). Other erase methods may be used.

Referring to FIG. 3C, in 310 an erase verify is performed. In one instance the erase verify is performed to ensure that the threshold voltage for all cells to be erased (e.g., a page) has been lowered below +3.1 V (i.e., $V_{cg}$ is set to +3.1 V). This erase verify reads a page (e.g., 512 8-bit words). Each word read takes about 0.2 µsec, and the total erase verify time is about 0.1 msec. If one or more cells fail the erase verify (e.g., "slow" cells), the process returns to 308 and another erase is performed. If all cells pass the erase verify, the process moves to 312.

Since the erase performed in 308 may over-erase some cells (e.g., "fast" cells), in 312 an over-erase verify is performed. In one instance this over-erase verify is a read operation that determines if any cell to be erased has a $V_T$ less than about 0.5 V. Over-erased cells may be considered to be in the depletion mode. Thus with $V_{cg}$ set to zero volts, an over-erased cell still conducts current during a read operation. This "leaky" cell causes various failures such as sub-bitline failures. (A sub-bitline is a portion of a bitline to which several cells are connected. Extra current from the leaky over-erased cell causes the programming status of the whole sub-bitline to be in error.) Hence a +0.5 V level is chosen for the over-erase verify to eliminate cells that leak current at or below +0.5 V. Similar to the erase verify, the over-erase verify for 512 8-bit words takes a total of about 0.1 msec. If all cells pass the over-erase verify, then the process ends since the $V_T$ for all cells is in the desired range set by the erase and over-erase verifications. If one or more cells fail the over-erase verify, the process moves to 314.

In 314 a Fowler-Nordheim $V_T$ convergence is performed in accordance with the invention so as to tighten the $V_T$ distribution of erased memory cells to within a specified range. This convergence operation raises the $V_T$ of the fast cells more quickly than the $V_T$ of normal and slow cells. Nevertheless, this convergence operation may raise the $V_T$ of some cells above the maximum allowable erase $V_T$ distribution limit, and so the process moves to 310 and another erase verify is performed. The process then continues among 308, 310, 312, and 314 as necessary until all cells are within the specified minimum and maximum $V_T$ convergence limits.

Figure 6:
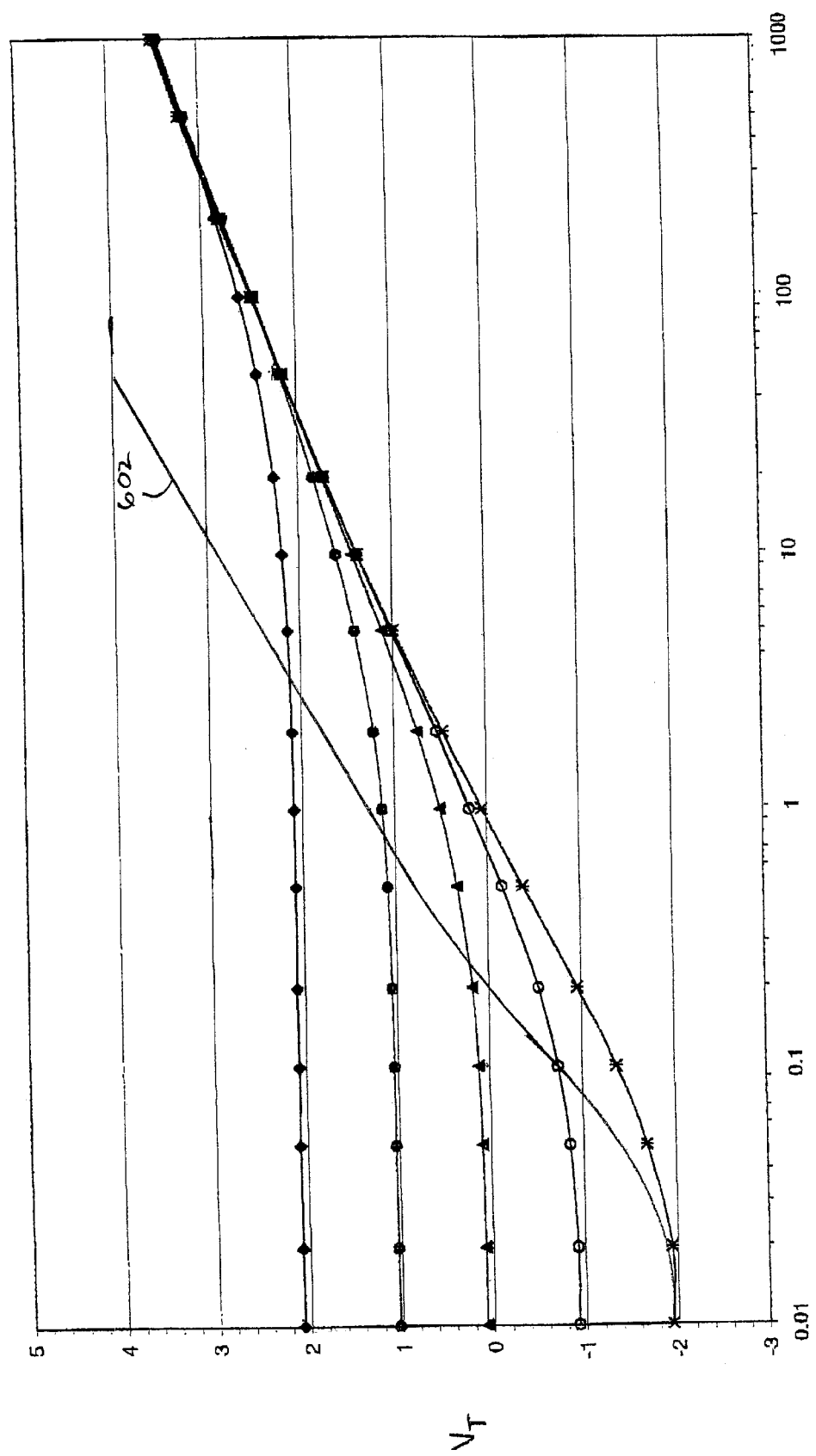
FIG. 6 is a graph plotting memory cell threshold voltage versus time.

In one instance the desired $V_T$ for all erased cells is about 1–2 volts after convergence. In another instance, the desired $V_T$ for all erased cells is about +1.5–2 volts after convergence. FIG. 6 is a graph showing how $V_T$ (vertical axis) varies with time (horizontal axis) during a $V_T$ convergence operation. In FIG. 6, $V_{cg}$ is about +12 V and $V_s$, $V_d$, and $V_b$ are about −4 V (i.e., about 16 volt potential across the floating gate). As shown in FIG. 6, if these voltages are applied for about 1 msec, the $V_T$ of a cell initially having a −2 V $V_T$ (curve defined by Xs) is raised to about 0 V, the $V_T$ of a cell initially having 0 V $V_T$ (curve defined by solid triangles) is raised to about +0.5 V, and the $V_T$ of a cell having a +2 V $V_T$ (curve defined by solid diamonds) remains substantially the same.

Figure 7:
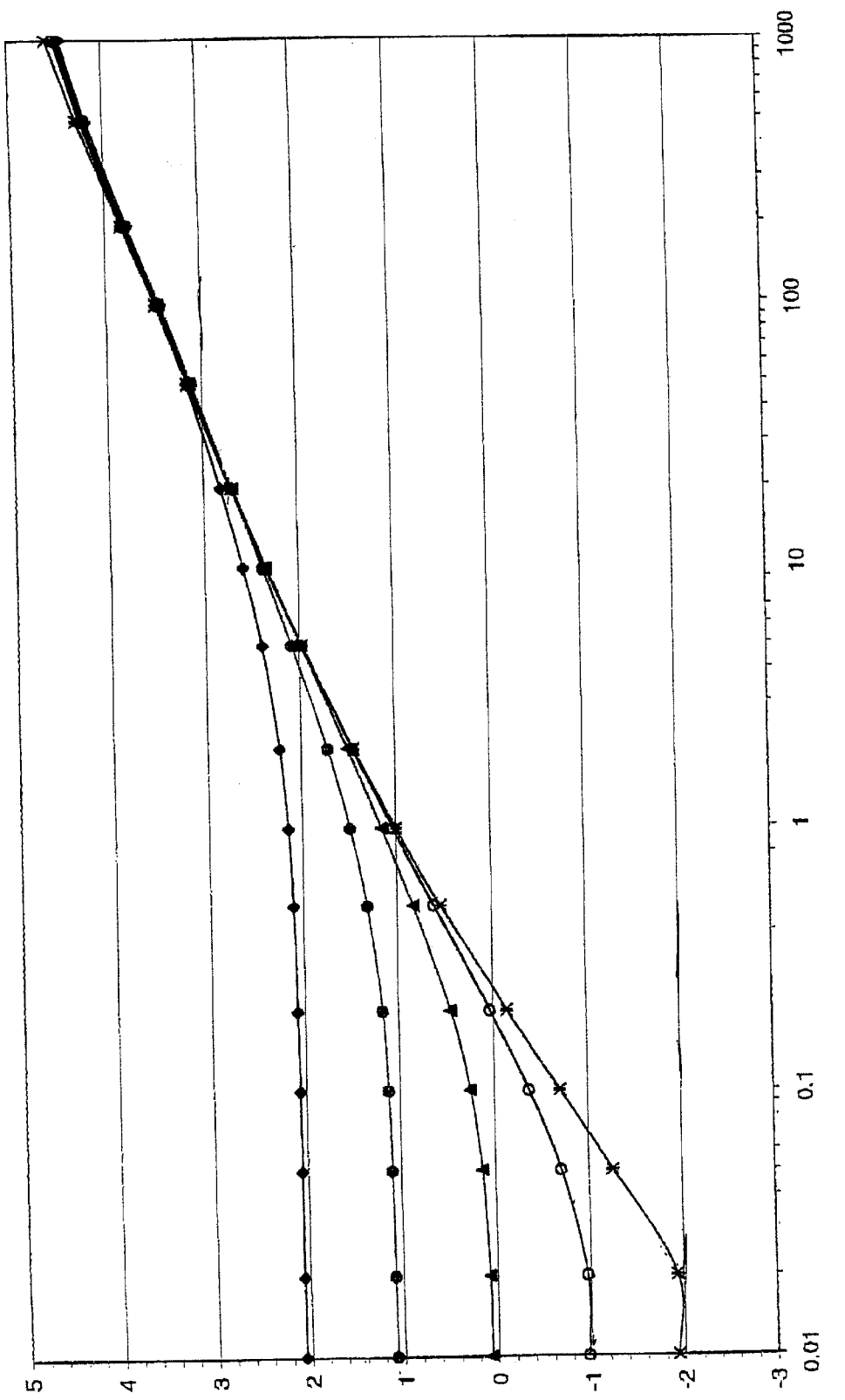
FIG. 7 is a second graph plotting memory cell threshold voltage versus time.

FIG. 7 is a graph similar to FIG. 6, but for $V_{cg}$ about +12 V and $V_s$, $V_d$, and $V_b$ about −5 V. The voltage conditions shown in FIG. 7 raise the cell $V_T$s relatively more quickly than for those shown in FIG. 6. It can be seen in FIG. 7 that the $V_T$ of a cell initially having a $V_T$ of about +2 V (curve defined by solid diamonds) begins to increase if the voltages are applied for more than about 1 msec.

Figure 8:
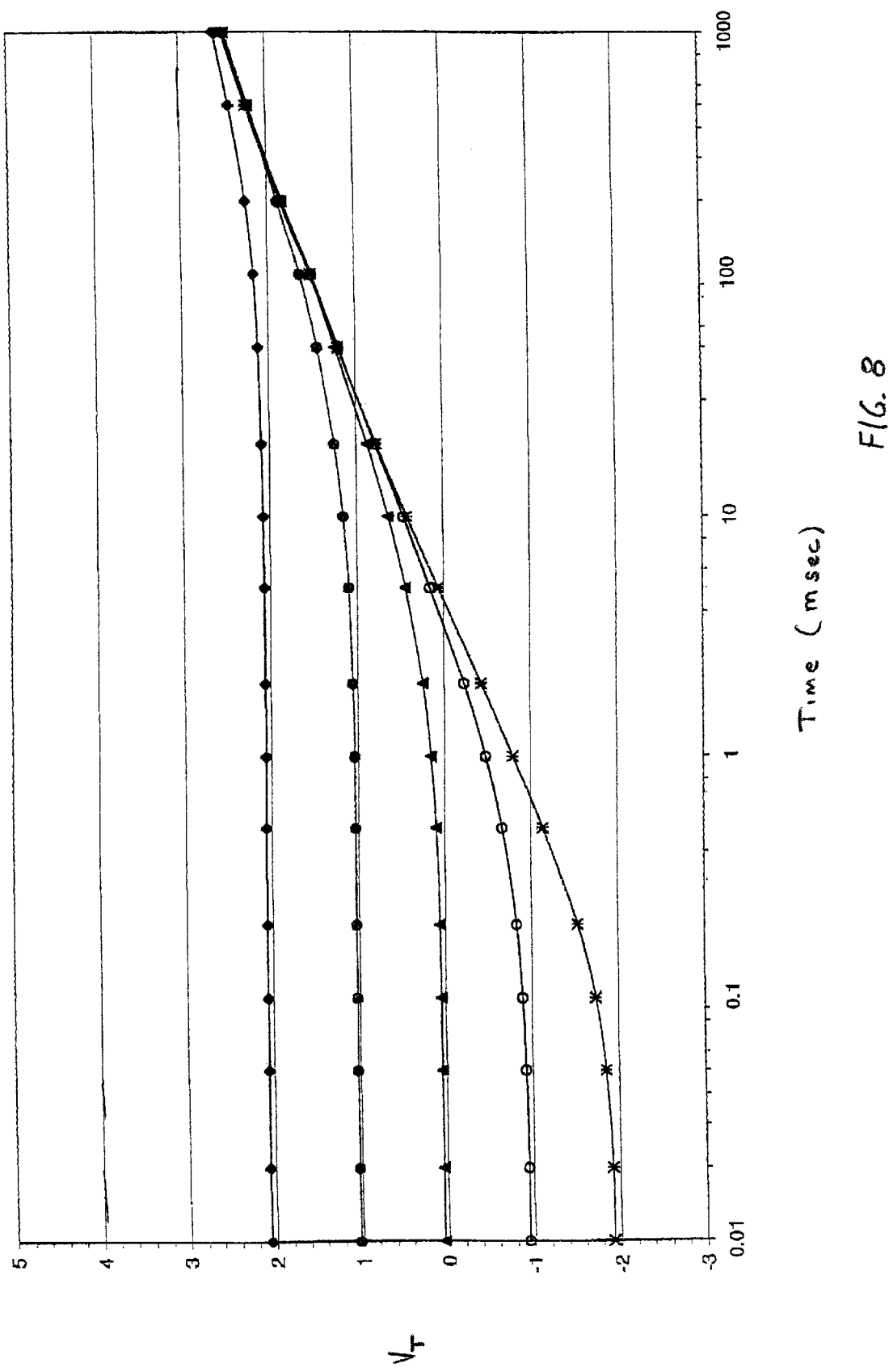
FIG. 8 is a third graph plotting memory cell threshold voltage versus time.

FIG. 8 is a graph similar to FIG. 6 but for $V_{cg}$ about +12 V and $V_s$, $V_d$, and $V_b$ about −3 V. The voltage conditions shown in FIG. 8 raise the cell $V_T$s relatively more slowly than for those shown in FIG. 6. It can be seen in FIG. 8 that the $V_T$ of a cell initially having a $V_T$ of about +2 V (curve defined by solid diamonds) does not begin to increase until the voltages are applied for about 100 msec.

FIGS. 6, 7, and 8 illustrate that for some convergence pulse durations (e.g., 1 msec), various electric potentials across the floating gate will have little effect on the $V_T$ of cells having a relatively high $V_T$ (e.g., +2 V) but will control the amount of $V_T$ change for cells having a relatively low $V_T$ (e.g., −2 V). Furthermore, fast cells will have curve slopes that are steeper than those shown in FIGS. 6, 7, and 8 (i.e., $V_T$ rises more quickly). In FIG. 6, for example, curve 602 represents $V_T$ change for an illustrative fast cell having an initial $V_T$ of about −2 V. Slow cells will have slopes that are less steep than those shown in FIGS. 6, 7, and 8 (i.e., $V_T$ rises more slowly). In accordance with the invention, convergence pulse durations and voltages are selected so that memory cells having $V_T$ within the desired $V_T$ convergence distribution are relatively unaffected, but memory cells having $V_T$ below the desired $V_T$ distribution are quickly raised to within the desired $V_T$ range. Lower voltage pulses are applied at first to move the fast bit $V_T$ close to the desired $V_T$ range. Then, increasingly larger voltage pulses are applied to move a larger number of cells into the desired $V_T$ range.

Figure 9A:
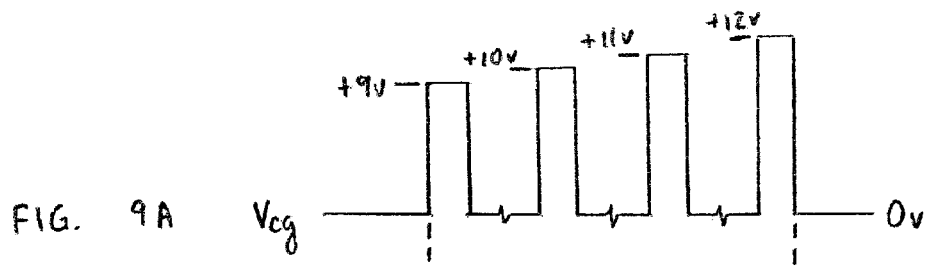
FIGS. 9A–9E are signal timing diagrams.
Figure 9B:
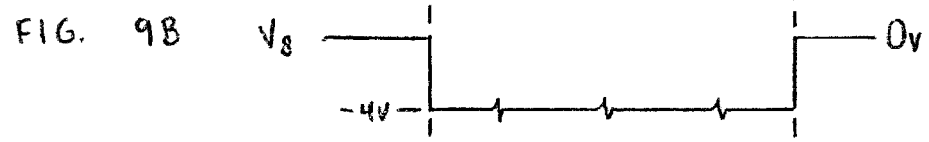
Figure 9C:
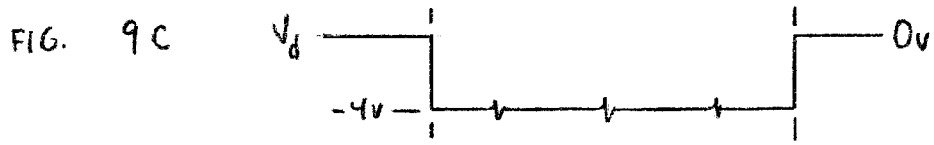
Figure 9D:
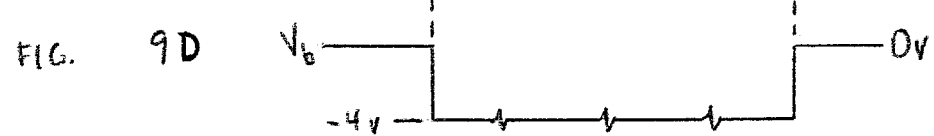
Figure 9E:
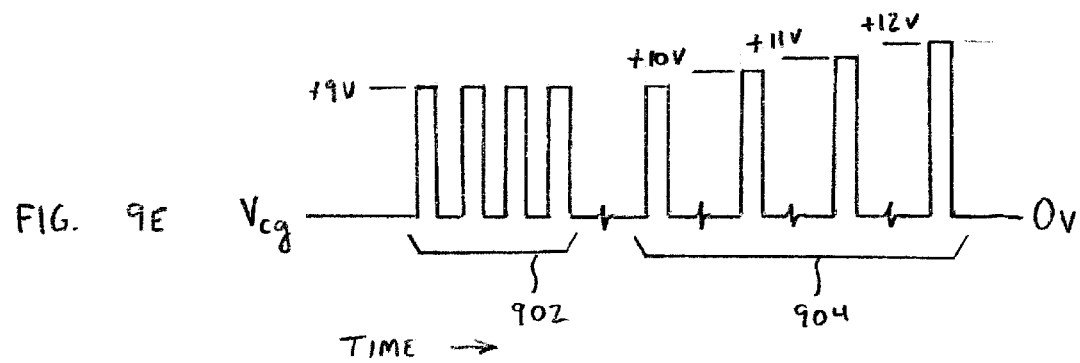

FIGS. 9A–9D illustrate an embodiment of convergence 314 (FIG. 3C). $V_s$, $V_d$, and $V_b$ are set to a negative voltage (e.g., −4 V) and $V_{cg}$ receives a series of positive voltage pulses in a convergence signal. The voltage of each subsequent $V_{cg}$ pulse is higher than the voltage of the preceding pulse. As shown in FIG. 9A, for example, $V_{cg}$ first receives a +9 V pulse, followed by +10V, +11 V, and +12 V pulses. In one embodiment each $V_{cg}$ pulse duration is approximately 300 μsec. In some embodiments erase verify 310 (FIG. 3C) is performed during the interval following each $V_{cg}$ pulse. In other embodiments $V_{cg}$ receives two or more pulses before erase verify 310 is performed. FIG. 9E illustrates another convergence 312 embodiment. As shown in FIG. 9E, a series 902 of constant voltage $V_{cg}$ pulses is used, followed by a series 904 of increasing voltage $V_{cg}$ pulses. Each series 902,904 pulse duration is about 200–300 μsec, although other pulse durations may be used. $V_s$, $V_d$, and $V_b$ are as shown in FIGS. 9B–9D. In one embodiment an erase verify 308 is performed after the first series 902, and after every pulse in the second series 904. In other embodiments, a series of 8 pulses as illustrated by series 902 and 904 is performed prior to the erase verify.

The duration between convergence pulses in all embodiments may be very short (e.g., less than 1 μsec) such that the duration is sufficient to cause charges to move as by short pulses rather than a longer pulse.

Figure 10A:
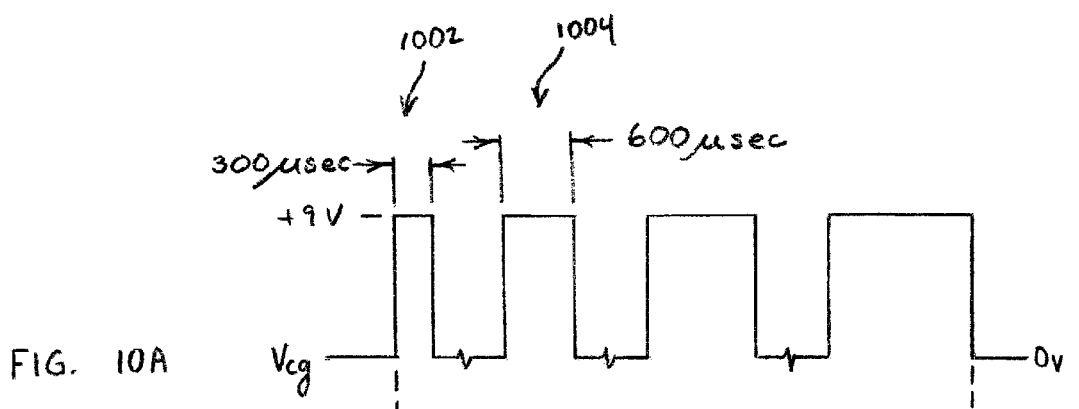
FIGS. 10A–10E are signal timing diagrams.
Figure 10B:
Figure 10C:
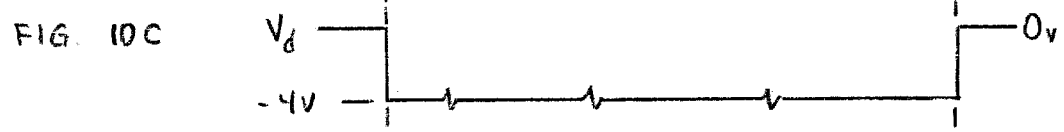
Figure 10D:
Figure 10E:
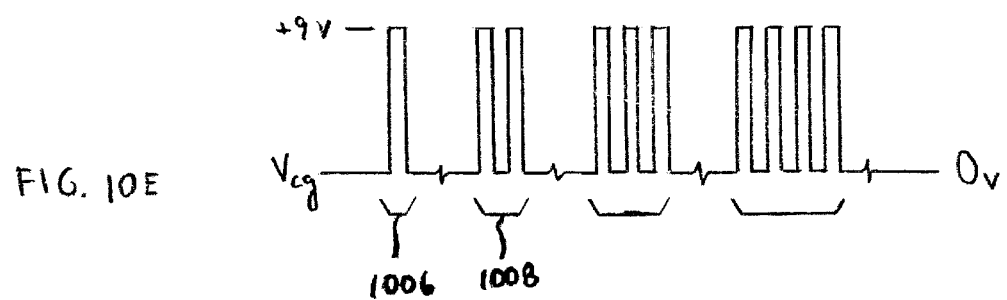

FIGS. 10A–10D illustrate another embodiment of convergence 314. $V_s$, $V_d$, and $V_b$ are set to a negative voltage (e.g., −4 V) and $V_{cg}$ receives a series of pulses in a convergence signal. The duration of each subsequent $V_{cg}$ pulse is longer than the duration of the preceding pulse. As shown in FIG. 10A, for example, first $V_{cg}$ pulse 1002 lasts about 300 μsec and second $V_{cg}$ pulse 1004 lasts about 600 μsec. Subsequent pulse durations are progressively longer. These durations are illustrative and other pulse durations may be used. In one embodiment an initial series of same duration pulses is used (e.g., 902 in FIG. 9E) prior to using pulses of increasing duration. In one embodiment, erase verify 310 and over-erase verify 312 are performed after each $V_{cg}$ pulse. In other embodiments, more than one $V_{cg}$ pulse is received before erase verify 308 and over-erase verify 312 are performed. FIG. 10E illustrates another convergence 314 embodiment. Instead of increasing the duration of constant voltage $V_{cg}$ pulses in the convergence signal, as illustrated in FIG. 10A, sets of short duration (e.g., 200–300 μsec) positive voltage pulses are used, and each subsequent set includes more pulses than the preceding set. FIG. 10E shows, for example, that $V_{cg}$ pulse set 1006 includes one pulse, pulse set 1008 includes two pulses, and so on. $V_s$, $V_d$, and $V_b$ are as shown in FIGS. 10B–10D. In one embodiment, erase verify 310 and over-erase verify 312 are performed after each pulse set. In other embodiments, two or more pulse sets are performed prior to verify operations.

Figure 11A:
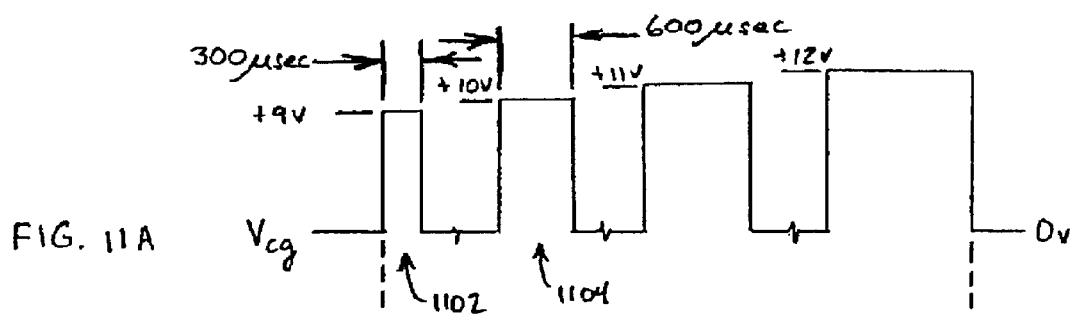
FIGS. 11A–11E are signal timing diagrams.
Figure 11B:
Figure 11C:
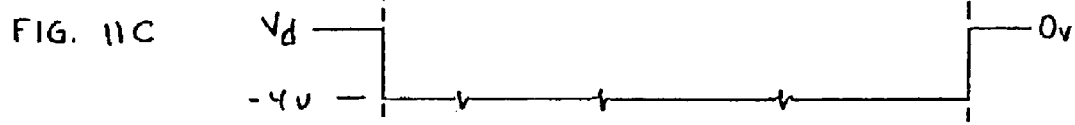
Figure 11D:
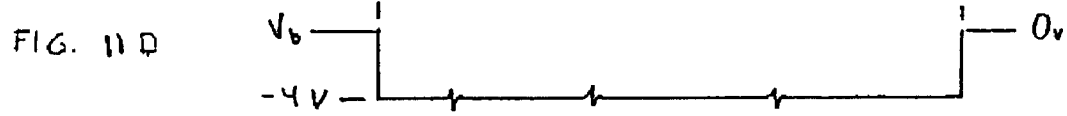
Figure 11E:
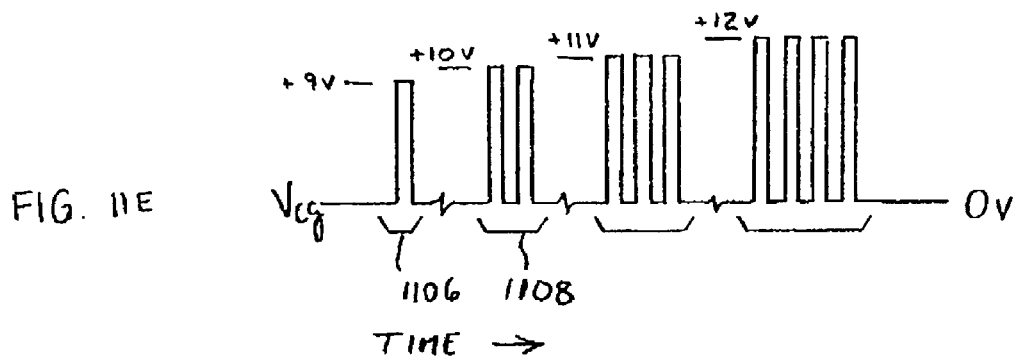

FIGS. 11A–11D illustrate yet another embodiment of convergence 314. $V_s$, $V_d$, and $V_b$ are set to a negative voltage (e.g., −4 V) and $V_{cg}$ receives a series of pulses in a convergence signal. Both the voltage and duration of each subsequent $V_{cg}$ pulse is increased from the voltage and duration of the preceding pulse. As shown in FIG. 11A, for example, first $V_{cg}$ pulse 1102 is about +9 V and lasts about 300 μsec, second $V_{cg}$ pulse 1104 is about +10 V and lasts about 600 μsec, and so on. These pulse voltages and durations are illustrative and other voltages and durations may be used. In one embodiment an initial series of same voltage and same duration pulses is used (e.g., 902 in FIG. 9E) prior to using $V_{cg}$ pulses of increasing voltage and duration. In one embodiment erase verify 310 and over-erase verify 312 are performed after each $V_{cg}$ pulse. In other embodiments, more than one $V_{cg}$ pulse is received before erase verify 310 and over-erase verify 312 are performed. FIG. 11E illustrates another convergence 314 embodiment. Instead of increasing the duration of the increasing voltage $V_{cg}$ pulses in the convergence signal, as illustrated in FIG. 11A, sets of short duration (e.g., 200–300 μsec) pulses are used in which each subsequent set includes more pulses at a higher voltage than the preceding set. FIG. 11E shows, for example, that $V_{cg}$ pulse set 1106 includes one +9 V pulse, pulse set 1108 includes two +10 V pulses, and so on. $V_s$, $V_d$, and $V_b$ are as shown in FIGS. 11B–11D. In one embodiment, erase verify 310 and over-erase verify 312 are performed after each pulse set. In other embodiments, two or more pulse sets are performed prior to the verify operations.

The −4 V settings for $V_s$, $V_d$, and $V_b$ as described in relation to FIGS. 9A–9E, 10A–10E, and 11A–11E are illustrative, and other voltages that may be used. In other embodiments, for example, voltages in the range −4 V to −6 V are used. In one such embodiment voltages (e.g., $V_b$) are selectable within this voltage range.

In accordance with the invention, in one embodiment a complete page erase and convergence is performed in less than 10 msec. In a situation using a 512 word page length, the program verify takes about 0.1 msec (512*0.2 μsec read), the pre-program takes about 1 msec (512*2 μsec pulse), the erase verify takes about 0.1 msec (512*0.2 μsec read), the erase takes about 6 msec (4 pulses*1.5 msec), the over-erase verify takes about 0.1 msec (512*0.2 μsec read), and the convergence takes about 2.4 msec (8 pulses*300 μsec), thus totaling about 9.7 msec.

Figure 12A:
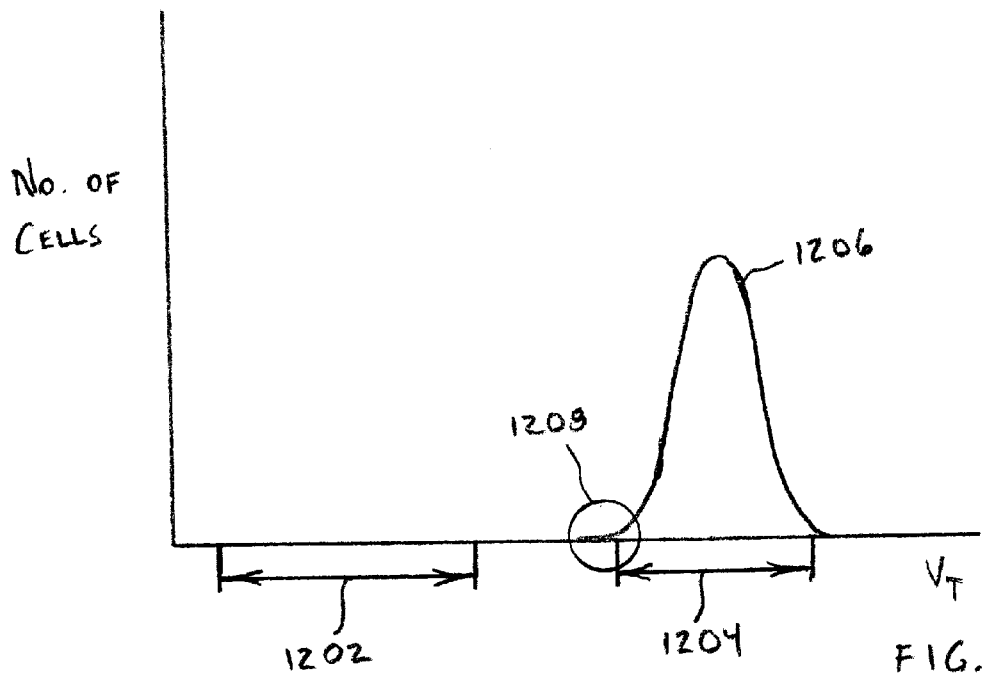
FIGS. 12A and 12B are graphs plotting number of memory cells versus threshold voltage.

In another aspect of the invention, a series of threshold convergence pulses is used to converge the $V_T$ distribution of programmed cells. Using the convergence pulse and voltage embodiments described above, marginally programmed cells having a $V_T$ at the tail (lower extreme) of the programmed $V_T$ distribution are raised. FIG. 12A is a graph showing an illustrative programmed cell $V_T$ distribution. Unprogrammed cells have a desired $V_T$ in lower $V_T$ range 1202 (e.g., +0.5–+2.0 V). Programmed cells have a desired $V_T$ in upper $V_T$ range 1204. Curve 1206 represents the $V_T$ distribution of programmed cells. A small number of programmed cells have a $V_T$ that is just at the lower margin of upper $V_T$ range 1204, as shown in highlight 1208. Programmed cells having marginal $V_T$ 1208 may be, for example, fast bits that tend to lose programming charge or cells otherwise having a $V_T$ disturbed from the desired programmed $V_T$.

Figure 12B:
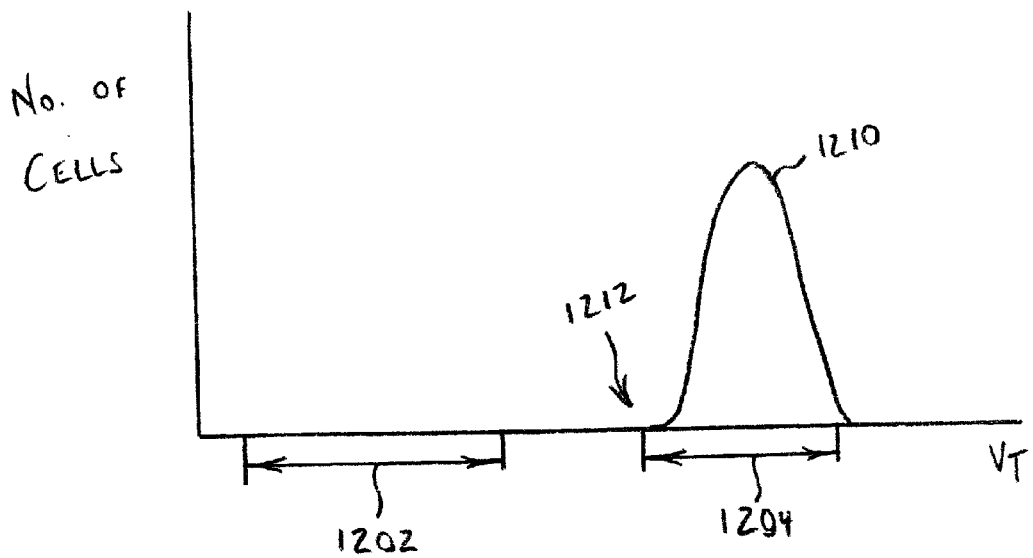

In accordance with the invention, Fowler-Nordheim convergence pulses such as those described above with reference to 314 (FIG. 3C) are applied to programmed cells to converge the $V_T$ of cells having marginal $V_T$ 1208 towards the desired upper $V_T$ range 1204. Since the curves for "fast" cells are relatively steep compared to the curves for typical cells as illustrated in FIGS. 6, 7, and 8, the $V_T$ of "fast" cells is raised to within range 1204 without significantly affecting the $V_T$ of other programmed cells. The convergence pulses may be applied in various ways. In one embodiment, the convergence pulses are applied to all programmed cells. In another embodiment, the convergence pulses are applied to select numbers of programmed cells. In yet another embodiment, the programmed cells having marginal $V_T$ are identified and the convergence pulses are applied to the identified cells. The resulting programmed cell $V_T$ distribution is shown in FIG. 12B. FIG. 12B shows at 1212 that the programmed cells having $V_T$ at the lower margin of range 1204 now have $V_T$ within range 1204. Erase control unit 212 (FIG. 2) is illustrative of the control unit used to effect the programmed cell $V_T$ convergence.

Skilled individuals will understand that although embodiment have been described using $V_{cg}$ pulses and constant $V_s$, $V_d$, $V_b$, and $V_{nw}$ that other methods of shaping the waveform of the pulsed electric potential across the floating gate may be used to perform threshold voltage convergence. For example, $V_s$, $V_d$, $V_b$ and/or $V_{nw}$ may be made increasingly negative while the $V_{cg}$ pulses are kept at the same voltage. As another example, $V_{cg}$ is constant and $V_s$, $V_d$, $V_b$ and/or $V_{nw}$ is pulsed as described above for $V_{cg}$. Skilled individuals will further understand that various modifications and adaptations may be made to the embodiments disclosed herein. For example, P-type memory cells may be used, in which case voltage polarities are reversed, and various memory array architectures may be used. Thus the invention is limited only by the following claims.

We claim:

1. A method of adjusting a threshold voltage of a transistor, comprising the acts of:
   applying a first electric potential to a first terminal of the transistor; and
   applying a convergence signal to a second terminal of the transistor, wherein the convergence signal comprises a first pulse and a second pulse, the first pulse comprising a first voltage, the second pulse comprising a second voltage larger than the first voltage.

2. The method of claim 1, wherein the first terminal is coupled to a semiconductor body region and the second terminal is coupled to an electrically conductive gate electrode.

3. The method of claim 1, wherein the first terminal is coupled to an electrically conductive gate electrode and the second terminal is coupled to a semiconductor body region.

4. The method of claim 1, wherein the first terminal is coupled to a source/drain region and the second terminal is coupled to an electrically conductive gate electrode.

5. The method of claim 1, wherein the first terminal is coupled to an electrically conductive gate electrode and the second terminal is coupled to a source/drain region.

6. The method of claim 1, wherein the first voltage is a negative voltage and the voltages of the pulses are positive voltages.

7. The method of claim 1, wherein the first voltage is a positive voltage and the voltages of the pulses are negative voltages.

8. The method of claim 1, wherein the first voltage is a ground electric potential.

9. The method of claim 1 further comprising the acts of:
   determining a threshold voltage of the transistor after the first pulse;
   and applying the second pulse if the determined threshold voltage is outside a predetermined range of threshold voltages.

10. The method of claim 1, wherein the second pulse is a longer duration than the first pulse.

11. The method of claim 1, wherein the convergence signal is applied for not more than 3 microseconds.

12. The method of claim 1 further comprising the act of adjusting the threshold voltage into a desired threshold voltage range, wherein the desired range identifies a memory cell as being unprogrammed.

13. The method of claim 1 further comprising the act of adjusting the threshold voltage into a desired threshold voltage range, wherein the desired range identifies a memory cell as being programmed.

14. A method of adjusting a threshold voltage of a transistor, comprising the acts of:
   applying a first voltage to a first terminal of the transistor; and
   applying a convergence signal to a second terminal of the transistor, wherein the convergence signal comprises a first pulse and a second pulse, the first pulse comprising a particular voltage and a first duration, the second pulse comprising the particular voltage and a second duration longer than the first duration.

15. The method of claim 14, wherein the first terminal is coupled to a semiconductor body region and the second terminal is coupled to an electrically conductive gate electrode.

16. The method of claim 14, wherein the first terminal is coupled to an electrically conductive gate electrode and the second terminal is coupled to a semiconductor body region.

17. The method of claim 14, wherein the first terminal is coupled to a source/drain region and the second terminal is coupled to an electrically conductive gate electrode.

18. The method of claim 14, wherein the first terminal is coupled to an electrically conductive gate electrode and the second terminal is coupled to a source/drain region.

19. The method of claim 14, wherein the first voltage is a negative voltage and the voltages of the pulses are positive voltages.

20. The method of claim 14, wherein the first voltage is a positive voltage and the voltages of the pulses are negative voltages.

21. The method of claim 14, wherein the first voltage is a ground electric potential.

22. The method of claim 14 further comprising the acts of:
   determining a threshold voltage of the transistor after the first pulse; and applying the second pulse if the determined threshold voltage is outside a predetermined range of threshold voltages.

23. The method of claim 14 further comprising the act of adjusting the threshold voltage into a desired threshold voltage range, wherein the desired range identifies a memory cell as being unprogrammed.

24. The method of claim 14 further comprising the act of adjusting the threshold voltage into a desired threshold voltage range, wherein the desired range identifies a memory cell as being programmed.

25. A method of adjusting a threshold voltage of a transistor, comprising the acts of:
   applying a first electric potential to a first terminal of the transistor; and
   applying a convergence signal to a second terminal of the transistor, wherein the convergence signal comprises a first set of pulses and a second set of pulses, the first set of pulses comprising a first voltage, the second set of pulses comprising more pulses than the first set of pulses, each pulse in the second set comprising a second voltage larger than the first voltage.

26. A method of erasing a flash electrically erasable programmable read-only memory (flash EEPROM) comprising the acts of:

defining a page in a memory array, wherein the page comprises a set of memory cells;

erasing the set of memory cells by applying voltage across memory cells in the set such that a threshold voltage of each unique cell in the set is made less than a maximum threshold voltage; and applying a convergence signal to over-erased memory cells in the set such that threshold voltages of the over-erased memory cells are made more than a minimum threshold voltage, wherein the convergence signal comprises a first pulse and a second pulse, the first pulse comprising a first voltage, the second pulse comprising a second voltage larger than the first voltage.

27. The method of claim 26, wherein the duration of the second pulse is longer than the duration of the first pulse.

28. The method of claim 26, wherein the convergence signal is applied for not more than 3 microseconds.

29. A method of erasing a flash electrically erasable programmable read-only memory (flash EEPROM) comprising the acts of:

defining a page in a memory array, wherein the page comprises a set of memory cells;

erasing the set of memory cells by applying voltage across memory cells in the set such that a threshold voltage of each unique cell in the set is made less than a maximum threshold voltage; and applying a convergence signal to over-erased memory cells in the set such that threshold voltages of the over-erased memory cells are made more than a minimum threshold voltage, wherein the convergence signal comprises a first pulse and a second pulse, the first pulse comprising a particular voltage and a first duration, the second pulse comprising the particular voltage and a second duration longer than the first duration.

30. An integrated circuit comprising:

a memory array; and a control unit coupled to the memory array and controlling a convergence signal applied to at least one memory cell in the memory array, wherein the convergence signal comprises a first pulse and a second pulse, the first pulse comprising a first voltage, the second pulse comprising a second voltage larger than the first voltage.

31. The integrated circuit of claim 30, wherein the integrated circuit comprises a serial flash electrically erasable programmable read-only memory.

32. The integrated circuit of claim 30, wherein the convergence signal adjusts a threshold voltage of the or each memory cell into a desired threshold voltage range, wherein the desired range identifies a memory cell as being unprogrammed.

33. The integrated circuit of claim 30, wherein the convergence signal adjusts a threshold voltage of the at least one memory cell into a desired threshold voltage range, wherein the desired range identifies a memory cell as being programmed.

34. An integrated circuit comprising:

a memory array; and a control unit coupled to the memory array and controlling a convergence signal applied to one or more memory cells in the memory army, wherein the convergence signal comprises a first pulse and a second pulse, the first pulse comprising a particular voltage and a first duration, the second pulse comprising the particular voltage and a second duration longer than the first duration.

35. The integrated circuit of claim 34, wherein the integrated circuit comprises a serial flash electrically erasable programmable read-only memory.

36. The integrated circuit of claim 34, wherein the convergence signal adjusts a threshold voltage of the or each memory cell into a desired threshold voltage range, wherein the desired range identifies a memory cell as being unprogrammed.

37. The integrated circuit of claim 34, wherein the convergence signal adjusts a threshold voltage of the or each memory cells into a desired threshold voltage range, wherein the desired range identifies a memory cell as being programmed.

38. A method of setting threshold voltage in a non-volatile floating gate EPROM memory transistor to between a low threshold level and a high threshold level, the memory transistor having a control gate, a floating gate, and a channel substrate region defined between a source and a drain, the method comprising:

establishing the threshold voltage to less than the high threshold level;

increasing the threshold voltage by a first increment;

determining that the threshold voltage from the first increment increasing step is less than the low threshold level;

increasing the threshold voltage by a second increment; and determining that the threshold voltage from the second increment increasing step is greater than the low threshold level.

39. The method of claim 38 wherein:

the first increment increasing step comprises establishing a first positive pulse on the control gate relative to the channel substrate region, the first positive pulse being of a first voltage; and the second increment increasing step comprises establishing a second positive pulse on the control gate relative to the channel substrate region, the second positive pulse being of a second voltage greater than the first voltage.

40. The method of claim 39 wherein the first positive pulse and the second positive pulse have an equal duration.

41. The method of claim 38 wherein:

the first increment increasing step comprises establishing a first positive pulse on the control gate relative to the channel substrate region, the first positive pulse being of a first duration; and the second increment increasing step comprises establishing a second positive pulse on the control gate relative to the channel substrate region, the second positive pulse being of a second duration greater than the first duration.

42. The method of claim 41 wherein the first positive pulse and the second positive pulse have an equal voltage level.

43. The method of claim 38 wherein:

the first increment increasing step comprises establishing a first set of positive pulses on the control gate relative to the channel substrate region, the pulses of the first pulse set being of a first duration; and the second increment increasing step comprises establishing a second set of positive pulses on the control gate relative to the channel substrate region, the pulses of the second pulse set being of a second duration greater than the first duration.

44. The method of claim 43 wherein:

each of the pulses of the first pulse set have a uniform peak voltage; and each of the pulses of the second pulse set have a uniform peak voltage that is greater than the peak voltage of the pulses of the first pulse set.

45. The method of claim 43 wherein:

the first pulse set consists of a predetermined number of pulses; and the second pulse consists of a predetermined number of pulses greater than the number of pulses in the first pulse set.

46. The method of claim 45 wherein:

each of the pulses of the first pulse set have a uniform peak voltage; and each of the pulses of the second pulse set have a uniform peak voltage that is greater than the peak voltage of the pulses of the first pulse set.

47. The method of claim 38 further comprising:

determining that the threshold voltage is greater than the high threshold level; and incrementally decreasing the threshold voltage.

48. An integrated circuit comprising:

a plurality of non-volatile floating gate EEPROM memory transistors having variable threshold voltages, each having a control gate, a floating gate, and a channel substrate region defined between a source and a drain;

a first voltage driver coupled to at least one of the source, the drain, and the channel substrate regions of the memory transistors;

a word line coupled to the control gates of the memory transistors;

a second voltage driver coupled to the word line; and a control unit coupled to the first voltage driver and to the second voltage driver and having logic for establishing the threshold voltage in the memory transistors to less than the high threshold level, and thereafter for controlling the first and second voltage drivers to increase the threshold voltage incrementally for so long as the threshold voltage of any one of the memory transistors is less than the low threshold level.

49. The integrated circuit of claim 48 wherein the incremental increase in the threshold voltage is obtained by voltage pulses of increasing magnitude on the control gate.

50. The integrated circuit of claim 48 wherein the incremental increase in the threshold voltage is obtained by voltage pulses of increasing duration on the control gate.

51. The integrated circuit of claim 48 wherein the incremental increase in the threshold voltage is obtained by voltage pulses of increasing numbers on the control gate.

* * * * *